United States Patent
Leitz

(10) Patent No.: US 7,317,316 B2
(45) Date of Patent: Jan. 8, 2008

(54) APPARATUS AND METHOD FOR MEASURING THE INSULATION RESISTANCE OF A FUEL CELL SYSTEM

(75) Inventor: Juergen M Leitz, Osterburken (DE)

(73) Assignee: NuCellSys GmbH, Kirchheim/Tech-Nabern (DE)

( * ) Notice: Subject to any disclaimer, the term of this patent is extended or adjusted under 35 U.S.C. 154(b) by 0 days.

(21) Appl. No.: 11/170,093

(22) Filed: Jun. 29, 2005

(65) Prior Publication Data

US 2006/0003198 A1  Jan. 5, 2006

Related U.S. Application Data

(60) Provisional application No. 60/661,616, filed on Mar. 14, 2005.

(30) Foreign Application Priority Data

Jul. 2, 2004  (DE) ..................... 10 2004 032 230

(51) Int. Cl.
*H01H 31/12* (2006.01)
*H01M 8/00* (2006.01)
*H02G 3/00* (2006.01)

(52) U.S. Cl. ......................................... 324/551; 429/13
(58) Field of Classification Search ................. 324/551
See application file for complete search history.

(56) References Cited

U.S. PATENT DOCUMENTS 5,760,488 A * 6/1998 Sonntag ..................... 307/10.1
5,818,236 A * 10/1998 Sone et al. .................. 324/509
6,864,688 B2 * 3/2005 Beutelschiess et al. ..... 324/551
6,952,103 B2 * 10/2005 Herb et al. .................. 324/500
7,079,406 B2 * 7/2006 Kurokami et al. ........ 363/56.03
2004/0189330 A1 * 9/2004 Herb et al. .................. 324/691

* cited by examiner

*Primary Examiner*—Andrew H. Hirshfeld
*Assistant Examiner*—Jeff Natalini
(74) *Attorney, Agent, or Firm*—Crowell & Moring LLP

(57) ABSTRACT

A measuring device to measure the insulation resistance ($R_{iso}$) of a fuel cell system with respect to an electrical ground point comprises a resistor arrangement—formed by a series connection of reference resistors—between two load-current lines of the fuel cell system as well as one reference voltage source, which is arranged between the ground point and a node between the reference resistors and which is switchable between at least two different reference voltages ($U_{refo}$, $U_{refu}$). The measuring device further comprises one voltage-sensing device that acquires the voltage ($U_o$, $U_u$) between at least one of the load-current lines and the ground point. Connected to the voltage-sensing device is an evaluation unit, which determines the insulation resistance ($R_{iso}$) on the basis of a first voltage value, which represents a value of the voltage between a first of the load-current lines and the ground point while a first reference voltage ($U_{refo}$) of the reference voltage source is applied, and on the basis of a second voltage value, which represents the value of the voltage between the first load-current line and the ground point while a second reference voltage ($U_{refu}$) of the reference voltage source is applied.

15 Claims, 1 Drawing Sheet

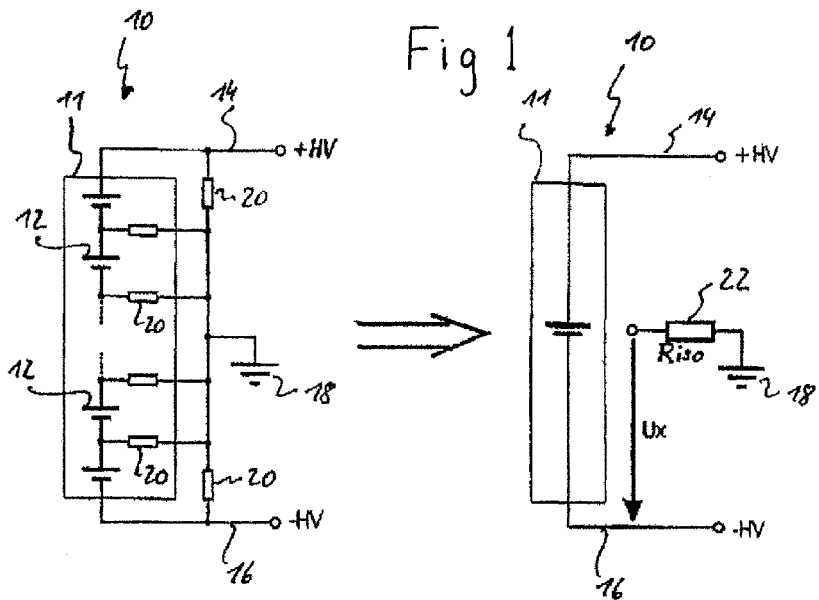
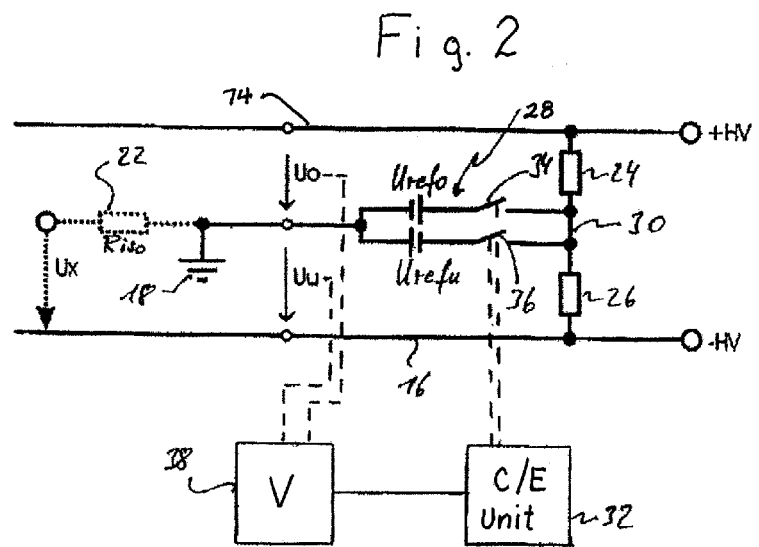

APPARATUS AND METHOD FOR MEASURING THE INSULATION RESISTANCE OF A FUEL CELL SYSTEM

CROSS-REFERENCE TO RELATED APPLICATION

This application claims the benefit under 35 U.S.C. § 119(e) of U.S. Provisional Patent Application No. 60/661,616 filed Mar. 14, 2005; and also claims priority to German Application No. 10 2004 032 230.9, filed Jul. 2, 2004. Both of these applications are incorporated herein by reference in their entireties.

BACKGROUND OF THE INVENTION

1. Field of the Invention

The invention pertains to an apparatus and a method for measuring the insulation resistance of a fuel cell system with respect to a point at electrical ground potential.

2. Description of the Related Art

U.S. Pat. No. 5,760,488 describes a so-called IT architecture (IT: isolated terra) for the load circuit of a vehicle-mounted fuel cell system, in which the load-current lines of the fuel cell system are isolated with respect to the vehicle chassis (vehicle ground). The electrical loads that are supplied by the load-current lines possess a low-resistance connection between their housings and vehicle ground in order to prevent dangerous contact potentials. Thus, the fuel cell voltage provided by the fuel cell system does not refer to vehicle ground potential; one might say that it floats with respect to the ground potential. One of the effects of a certain electrical conductivity of the cooling agent, which is used to cool the fuel cell system, is that the insulation resistance of the load circuit with respect to the vehicle ground is not infinite, but finite.

The present invention starts from a "floating" architecture of the fuel cell system as disclosed in U.S. Pat. No. 5,760,488, but without the restriction to vehicle applications. The invention can in principle be used for any desired stationary or mobile application, although vehicle applications are preferred.

For safety reasons, numerous regulations prescribe a specific lower limit (e.g., 100 k$\Omega$), below which the insulation resistance between the fuel cell system and the ground point must not fall. U.S. Pat. No. 5,760,488 describes the detection of fault situations by means of a bridge circuit placed between the load-current lines and the vehicle ground for the purpose of monitoring the insulation resistance. Normally, with a proper insulation resistance, the bridge circuit does not emit a signal. Only if the insulation resistance drops, does the bridge circuit output a signal, which is then amplified by a differential amplifier and initiates an appropriate response, for example a shutdown of the fuel cell system.

This solution according to U.S. Pat. No. 5,760,488 is not able to determine an absolute magnitude of the insulation resistance, rather it only allows differentiating between cases that are still considered proper and cases that are no longer considered proper.

BRIEF SUMMARY OF THE INVENTION

It is the objective of the invention to enable precise and reliable measurements of the insulation resistance.

In order to meet this objective, the invention presents an apparatus for measuring the insulation resistance of a fuel cell system against an electrical ground point, whereby this measuring apparatus comprises one resistor arrangement—formed by a series connection of reference resistors—between two load-current lines of the fuel cell system, one reference voltage source, which is arranged between the ground point and a node between the reference resistances and which is switchable between at least two different reference voltages, one voltage-sensing device that measures the voltage between at least one of the load-current lines and the ground point, as well one evaluation unit, which is connected to the voltage-sensing device and determines the insulation resistance on the basis of a first voltage value that represents the value of the voltage between a first of the load-current lines and the ground point while the first reference voltage of the reference voltage source is applied and on the basis of a second voltage value that represents a value of the voltage between the first load-current line and the ground point while a second reference voltage of the reference voltage source is applied.

The measuring device according to the invention is arranged symmetrically between the load-current lines of the fuel cell system. The system can be selectively modified by switching the reference voltage source from one reference voltage to the other one. This makes it possible to obtain voltage values between one of the load-current lines and the ground point under various measuring conditions. The voltage values obtained in this manner can be used to calculate the magnitude of the insulation resistance by applying Kirchhoff's current and voltage laws.

The magnitudes of the first and the second reference voltage preferably are the same, but have different polarity. Furthermore, the resistance values of the resistor arrangement between the node and each of the load-current lines are at least approximately equal.

It is possible for the provided fuel cell voltage of the fuel cell system to change between two successive measurements with different reference voltages. This is particularly the case if one waits a certain time after switching the reference voltage. Such a waiting interval is recommended to allow a complete charging/discharging of the unavoidable parasitic capacitances. In vehicular applications, fluctuations of the fuel cell voltage can arise for example due to acceleration or deceleration of the vehicle. It has been found that during practical operation the fuel cell the voltage can occasionally fluctuate significantly.

To be able to reliably determine the insulation resistance despite such fluctuations of the fuel cell voltage, a preferred embodiment intends that the evaluation unit is designed to derive the first voltage value from two or more first measured values, which represent for different times the voltage between the first load-current line and the ground point while the first reference voltage is applied, and/or to derive the second voltage value from two or more second measured values, which represent for different times the voltage between the first load-current line and the ground point while the second reference voltage is applied.

This means that in this embodiment several measurements are taken—while the first or second reference voltage is applied—of the voltage between the first load-current line and the ground point. These several measured values are then used to derive the first or second voltage value that will be used to determine the insulation resistance. This allows to computationally compensate for fluctuations of the fuel cell voltage.

But preferably this evaluation unit is configured to form various pair combinations of one first and one second measured value and for this pair combination (hereinafter referred to as first pair combination) to form the respective difference between the corresponding values of the fuel cell voltage of the fuel cell system. Out of these first pair combinations, the evaluation unit determines the one for which the difference between the corresponding values of the fuel cell voltage of the fuel cell system is a minimum.

The evaluation unit can then use the first and second measured values of the determined first pair combination directly as first or second voltage value, which is especially recommendable if the absolute value of the difference of the fuel cell voltage values of this first pair combination falls below a specified threshold.

But it is also possible for the evaluation unit to use only one of the measured values of the determined first pair combination as first or second voltage value and to use a corrected value of the other measured value of this first pair combination as the other voltage value. This is particularly advantageous if the absolute value of the difference of the fuel cell voltage values of this first pair combination exceeds a predetermined threshold.

To determine the corrected measured value, the evaluation unit preferably forms pair combinations of two first or two second measured values and for this pair combinations (hereinafter referred to as second pair combinations) determines the difference between the associated fuel cell voltage values. Then it determines for which second pair combination the difference of the associated fuel cell voltage values is a maximum. Subsequently, the evaluation unit determines a quotient of the difference of the measured values of the determined second pair combination and the difference of the fuel cell voltage values of this second pair combination, whereupon it determines a correction value by multiplying this quotient with the difference of the fuel cell voltage values of the established first pair combination and adds this correction value to the other measured value. In this manner one obtains the corrected measured value, which is then used as the other voltage value in the calculation of the insulation resistance.

To solve the problem presented in the beginning, the invention also presents a method to measure the insulation resistance of a fuel cell system with respect to an electrical ground point by means of a measuring device that comprises:

one resistor arrangement—formed by a series connection of reference resistors—between two load-current lines of the fuel cell system, one reference voltage source, which is arranged between the ground point and a node between the reference resistors and which is switchable between at least two different reference voltages, one voltage-sensing device that measures the voltage between at least one of the load-current lines and the ground point.

The measuring method according to the invention is characterized by the step of determining the insulation resistance on the basis of a first voltage value, which represents a value of the voltage between a first of the load-current lines and the ground point while a first reference voltage of the reference voltage source is applied, and on the basis of a second voltage value, which represents a value of the voltage between the first load-current line and the ground point while a second reference voltage of the reference voltage source is applied.

According to the invention's measuring method, the first voltage value can be derived from two or more first measured values that for different points in time show the voltage between the first load-current line and the ground point while the first reference voltage is applied, or/and the second voltage value can be derived from two or more second measured values that for different points in time show the voltage between the first load-current line and the ground point while the second reference voltage is applied.

In this measuring method it is also possible to determine the particular first pair combination—out of various pair combinations, each consisting of a first measured value and a second measured value—, for which the difference between the associated values of the fuel cell voltage of the fuel cell system is a minimum. The first and second measured values of the determined first pair combination can then be used as the first or second voltage value, in particular if the magnitude of the difference of the fuel cell voltage values of this first pair combination falls below a predetermined threshold. Of course, if the absolute value of this difference exceeds a predetermined threshold, then one of the measured values of the determined first pair combination can be used as the first or second voltage value, while a corrected value of the other measured value is used as the other voltage value.

For this purpose, as part of the measuring method one preferably determines the particular second pair combination out of the different second pair combinations of two first or two second measured values, for which the difference between the associated fuel cell voltage values is a maximum. Subsequently one forms a quotient of the difference of the measured values of the determined second pair combination and the difference of the fuel cell voltage values of this second pair combination.

This quotient subsequently is multiplied with the difference of the fuel cell voltage values of the determined first pair combination and the corrected measured value is obtained by adding this correction value to the other measured value.

The invention also pertains to a computer program with program code means, which when executed by a processor effect the performance of the steps of the measuring method of the above-explained type. The computer program can for example be stored on a computer-readable data carrier, for example an optical or magnetic information-carrier disk.

An embodiment example of the invention is explained in more detail in the following with the help of the attached drawing.

BRIEF DESCRIPTION OF THE DRAWINGS

FIG. 1 shows a real circuit diagram of a fuel cell and its equivalent circuit.

FIG. 2 shows a circuit diagram of a resistance measuring circuit according to one embodiment example of the invention.

DETAILED DESCRIPTION OF THE INVENTION

The left half of FIG. 1 shows a fuel cell system 10 that consists of a multitude of fuel cells 12 that are electrically series-connected and combined to a stack 11. The fuel cell system 10 contains load-current lines 14, 16, between which is in effect the sum voltage of the individual voltages generated by the fuel cells 12. We refer to this sum voltage as fuel cell voltage. In the example shown in FIG. 1, the upper load-current line 14 is at a positive terminal potential +HV, while the lower load-current line 16 is at a negative terminal potential −HV. For applications in the motor vehicle sector, the fuel cell voltage can for example be several hundred volt. But the invention is not at all limited to this order of magnitude of the fuel cell voltage. Any other desired values of the fuel cell voltage are possible.

The load-current lines 14, 16 are insulated with respect to the ground point (ground system) 18. In this, the potentials of the load-current lines 14, 16 are not fixed with respect to the ground potential, but can shift with respect to the latter. One might say they float.

A circuit architecture of this type is also referred to as IT architecture. The electrical loads to be supplied (not shown in detail) are connected to the load-current lines 14, 16. At the same time, the housings of these loads are coupled by a low-resistance connection to the ground point 18 to prevent the occurrence of contact voltages. For the case of application in a motor vehicle, this is explained in detail in the above-mentioned U.S. Pat. No. 5,760,488, which hereby is expressly referenced.

The fuel cell system 10 is insulated against the ground point 18 by a finite resistance. This insulation resistance is made up of a multitude of partial resistances, which in FIG. 1 are labelled 20.

The right half of FIG. 1 shows the corresponding equivalent circuit diagram. Here, the various partial resistances 20 are combined into one total resistance 22, which is to be measured in the following. One problem in this is that the total insulation resistance 22 can not be associated with a specific point in the fuel cell system 10 and that for this reason the voltage Ux drawn in the equivalent circuit diagram is unknown. Since there are two unknown quantities, i.e., Ux and the insulation resistance 22, one requires two independent equations to determine Riso, i.e., the insulation resistance 22. To solve the two independent equations one requires at least two measurements under changed measuring conditions. Since it may take some time for the various parasitic capacitances of the system to charge/discharge after the measuring conditions have been changed, the various measurements should be separated by an adequate time period. For example, for parasitic capacitances of the system totaling approximately 1 µF, the time period between measurements should not be less than approximately one second.

It can not be guaranteed that the fuel cell voltage remains constant between measurements. On the contrary, the fuel cell voltage can sometimes be subject to significant fluctuations, in particular as a result of a change in power consumption of the connected electrical loads. Thus, a change in the fuel cell voltage between measurements means that not only has a defined intentional system change taken place but also an undefined system change. As a result of this undefined system change, the calculated insulation resistance may not be correct.

Nevertheless, the embodiment example described in the following allows a precise and reliable determination of the insulation resistance Riso even in the event of the occurrence of undefined system changes.

The resistance measuring circuit shown in FIG. 2 is used to measure the insulation resistance. In the illustrated example, this circuit comprises an arrangement of two series-arranged reference resistors or measuring resistors 24, 26, which preferably have at least approximately the same resistance value (e.g., 100, 120, or 200 kΩ). The resistance measuring circuit further comprises a reference voltage source, which is labelled 28. This source applies a variable-value reference voltage between the ground point 18 and the circuit node (labelled 30 in FIG. 2) between the two reference resistors 24, 26. In particular, the reference voltage source 28 is designed to optionally deliver a first reference voltage Urefo or a second reference voltage Urefu of identical magnitude but opposite polarity. The reference voltage source 28 can be switched between the different reference voltages by an electronic control and evaluation unit 32. In the illustrated example, two switches 34, 36 are provided for this, which can be alternately opened and closed by the control and evaluation unit 32. Depending on which switch 34, 36 is closed, the reference voltage source 28 delivers either the reference voltage Urefo or the reference voltage Urefu. In the shown example, the reference voltage Urefo is applied when the upper switch 34 is closed and the lower switch 36 is open. On the other hand, the reference voltage Urefu is applied when the lower switch 36 is closed and the upper switch 34 is open.

The resistance measuring circuit further comprises a voltage-sensing device 38, which measures the partial voltages between the ground point 18 and each of the load-current lines 14, 16, which are labelled Uo and Uu in FIG. 2. The voltage-sensing device 38 is connected with the control and evaluation unit 32 and sends the acquired measurement values to the latter. As an alternative to measuring the two partial voltages Uo and Uu, the voltage-sensing device 38 could only measure one of the partial voltages, e.g., the upper partial voltage Uo, if it additionally also measured the fuel cell voltage between the load-current lines 14, 16, i.e., the voltage between the potentials +HV and −HV.

The resistance measurement is performed in successive measuring cycles under control of the control and evaluation unit 32. Each measuring cycle consists of a first measurement, during which a first reference voltage of the reference voltage source 28 is applied, for example Urefo, and a second measurement, during which a second reference voltage is applied, for example Urefu. During each measurement, the voltage-sensing device 38 acquires measured values of the partial voltages Uo and Uu. A measuring cycle can for example be initiated by closing the upper switch 34 and opening the lower switch 36. The partial voltages Uo, Uu are not acquired immediately after the closing of the upper switch 34, but rather after a certain time period of for example approximately 1 s, to allow the charging/discharging of the various parasitic capacitances of the system. When this (predetermined) time period has passed, the voltage-sensing device 38 acquires the desired measured values and sends them to the control and evaluation unit 32, which stores them in a memory (not shown). The measured values of the partial voltages Uo, Uu that are acquired as part of such a first measurement can be referred to as first measured values.

Once the first measured values have been acquired and stored, in a second phase of every measuring cycle the upper switch 34 is opened and the lower switch 36 is closed. After the predetermined waiting period has passed, the voltage-sensing device 38 again acquires measured values of the partial voltages Uo, Uu. These measured values, referred to as second measured values, are as before send to the control and evaluation unit 32, which stores them.

Thus every measuring cycle provides for each of the partial voltages Uo, Uu one first measured value for an applied reference voltage Urefo and a second measured value for an applied reference voltage Urefu. These measured values can be used to calculate the value of the insulation resistance 22 by using Kirchhoff's current and voltage laws. For example, the following equation can be used to calculate the insulation resistance:

$$Riso = Rm \frac{Uoso - Uosu}{Urefo - Urefu - Uoso + Uosu}$$

where Rm denotes the resistance value resulting from a parallel connection of the reference resistors 24, 26, Uoso denotes the value of the upper partial voltage Uo when the upper switch 34 is closed (i.e., the reference voltage Urefo is applied), and Uosu denotes the value of the upper partial voltage Uo when the lower switch 36 is closed (i.e., the reference voltage Urefu is applied).

Naturally, the insulation resistance Riso can alternatively be calculated on the basis of voltage values of the lower partial voltage Uu while the reference voltages Urefo and Urefu are applied. The corresponding equation can easily be derived by applying Kirchhoff's current and voltage laws.

In this manner the insulation resistance Riso can be calculated on the basis of two voltage values of one of the partial voltages Uo, Uu, namely a first voltage value while one of the reference voltages (e.g., Urefo) is applied, and a second voltage value while a different reference voltage (e.g., Urefu) is applied. In one embodiment, it is possible to use as these voltage values directly the measured values of the corresponding partial voltage that were acquired in a single measuring cycle. However, it has already been mentioned that the fuel cell voltage, which is calculated as Uo+Uu, can on occasion fluctuate significantly between consecutive measurements. Thus, for the purpose of computationally compensating for these fluctuations, in a preferred embodiment the voltage values of the respective partial voltage (in this case the upper partial voltage Uo) that are used in the calculation of the insulation resistance Riso using the above-stated equation are derived taking into account the measured values of several consecutive measuring cycles. For example, the measured values of two consecutive measuring cycles can be used to find suitable values for Uoso and Uosu. It is also possible to evaluate measured values from three or even more consecutive measuring cycles for this purpose.

A method will be explained in the following on how to derive proper values for Uoso and Uusu on the basis of measured values from several consecutive measuring cycles.

Concerning this we refer to the following table, which contains example values for the partial voltages Uo and Uu as well as the fuel cell voltage (referred to as Ufc) calculated using these values, whereby the values were acquired in two consecutive measuring cycles.

| Measured parameter | Value in Volt | Ufc (calculated) |
| --- | --- | --- |
| Uoso(1) | 188.7 | 350.1 |
| Uuso(1) | −161.4 | |
| Uosu(1) | 130.2 | 287.7 |
| Uusu(1) | −157.5 | |
| Uoso(2) | 142.5 | 257.7 |
| Uuso(2) | −115.2 | |
| Uosu(2) | 155.7 | 338.7 |
| Uusu(2) | −183.0 | |

The meaning of Uoso and Uosu has already been explained above. Analogously, Uuso denotes a value of the lower partial voltage Uu for a closed upper switch 34 while Uusu is a value of this partial voltage for a closed lower switch 36. The bracketed index of the various measured values in the above table indicates the respective measuring cycle, i.e., the first measuring cycle or the second measuring cycle.

In the two measuring cycles one obtains a total of four measured values for the upper partial voltage Uo, namely two per measuring cycle. Now, first and second pair combinations are formed using the various measured values of the upper partial voltage Uo. First pair combinations are those that always consist of a first measured value and a second measured value of the upper partial voltage Uo. As mentioned earlier, the term first measured value refers to a measured value of the respective partial voltage that is acquired while the first reference voltage is applied, while the term second measured value denotes a measured value of that partial voltage that is acquired while a second, different reference voltage is applied. Thus, in the present example the measured values Uoso(1) and Uoso(2) can be considered first measured values. Consequently, the measured values Uosu(1) and Uosu(2) constitute second measured values. It can easily be seen that in the present example there are a total of four possible first pair combinations of the measured values of the upper partial voltage Uo.

On the other hand, second pair combinations are those that always consist of two first or two second measured values of the respective partial voltage. It can easily be seen that in the present example there are two possibilities of such second pair combinations for the upper partial voltage Uo.

Of course, if measured values of more than two measuring cycles are allowed the number of possible first and second pair combinations increases.

Now one has to find the particular one of the determined first pair combinations for which the difference of the associated fuel cell voltage values Ufc is a minimum. In the present example, a minimum is found for the difference of the pair combination of Uoso(1) and Uosu(2), namely 11.4 V.

A comparison step can be implemented, which compares the determined minimum difference of the fuel cell voltage values of the first pair combination to a predetermined first threshold. If this comparison establishes that this minimum difference falls below the predetermined first threshold, it may be intended that the two measured values of the respective first pair combination are used directly as first/second voltage value in the calculation of the insulation resistance. The first threshold may for example be chosen in dependence on the quantization accuracy of the measuring circuit, if the measured voltage values are represented in digital form.

On the other hand, the evaluation of the second pair combination focuses on finding the particular second pair combination with the maximum difference of the fuel cell voltage values. In the present example that is the combination Uoso(1) and Uoso(2). For this combination of first measured values the difference between the fuel cell voltage values is 92.4 V.

Alternatively or in addition to the above-mentioned comparison to a threshold, which can be carried out for the minimum difference of the fuel cell voltage values of the first pair combination, a similar comparison to a threshold can be performed for the maximum difference of the fuel cell voltage values of the second pair combination. For this, the determined maximum difference is compared to a predetermined second threshold that may be equal to or different from the first threshold. If the values are below the second threshold it may be intended that the two measured values of the determined first pair combination with the minimum difference between the fuel cell voltage values are used directly as the first and the second voltage value for the calculation of the insulation resistance Riso.

In contrast, if in the first threshold comparison the first threshold is exceeded or/an if in the second threshold comparison the second threshold is exceeded, one of the measured values of the determined first pair combination with minimum difference of the fuel cell voltage values will be subjected to a measured-value correction. The other measured value of the respective first pair combination is accepted without change as first or second voltage value.

If it has been decided that a measured-value correction is to be performed, a quotient is formed by dividing the difference of the measured values of the particular second pair combination for which the difference of the fuel cell voltage values has been determined to be the maximum by exactly this maximum difference of the fuel cell voltage values. As stated before, in the present example the maximum difference of the fuel cell voltage values of the second pair combination is 92.4 V, namely for the pair combination Uoso(1) and Uoso(2). In the present case, the difference between these measured values is 46.2 V (188.7 V−142.5 V). From this, one calculates a value of 0.5 for the quotient formed using the difference of the measured values and the difference of the fuel cell voltage values of this second pair combination.

In a subsequent step one determines a correction value by multiplying the quotient calculated in the above manner by the minimum difference of the fuel cell voltage values of the first pair combination. In the present example, this results in a correction value of 5.7 V (0.5×11.4 V).

The correction value determined in this manner now is added to one of the measured values of the determined first pair combination with the minimum difference of the fuel cell voltage values in order to obtain a corrected measured value. The sign of the addition (plus or minus) is dependent on which one of the measured values is being corrected. An addition with positive sign is performed if one corrects the measured value that yielded a lower value of the fuel cell voltage. On the other hand, the correction is performed with a negative sign if one is attempting to correct the measured value for which a higher value of the fuel cell voltage was established. In the present example, the measured value Uoso(1) is the measured value with the higher value of the fuel cell voltage (350.1 V) while Uosu(2) is the measured value with the lower value of the fuel cell voltage (338.7 V). Thus, to obtain a corrected value of the measured value Uosu(2), one adds with positive sign the correction value 5.7 V to this measured value, which yields a corrected measured value Uosu(2)* of 161.4 V (155.7 V+5.7 V). This corrected measured value Uosu(2)* now is used in the above-shown equation for the calculation of the insulation resistance Riso as value for the parameter Uosu, while the measured value Uoso(1) remains unchanged and is used as value for the parameter Uoso in said equation.

If—as an example—one assumes that the resistance value Rm is 120 kΩ (for values of the reference resistors 24, 26 of 240 kΩ each) and that the magnitudes of the reference voltages Urefo and Urefu are both 30 V, then substituting into the above equation yields a value of the insulation resistance Riso of 100.18 kΩ.

The insulation resistance Riso preferably is continuously re-calculated for every measuring cycle, whereby the measured values of the two (or more, depending on how many measuring cycles are taken into account) most recent measuring cycles are evaluated. In order to achieve higher accuracy in the determination of the insulation resistance Riso, one can increase the number of measuring cycles for which the measured values are evaluated. The accuracy of the determination of the resistance can also be influenced by the magnitude of the reference voltages.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. Apparatus for measuring insulation resistance of a fuel cell system with respect to an electrical ground point, said apparatus comprising:
   a resistor arrangement formed by a series connection of reference resistors between two load-current lines of the fuel cell system;
   a reference voltage source which is coupled between the ground point and a node between the reference resistors, said reference voltage source including at least first and second reference voltages and first and second switches which are actuable alternatively to apply either said first reference voltage or said second reference voltage, respectively to said node via an output of said reference voltage source;
   a voltage-sensing device, which acquires the voltage between at least one of the load-current lines and the ground point; and
   an evaluation unit that is connected to the voltage-sensing device and determines the insulation resistance on the basis of a first voltage value between a first of the load-current lines and the ground point while the first reference voltage of the reference voltage source is applied to said node, and on the basis of a second voltage value between the first load-current line and the ground point while the second reference voltage of the reference voltage source is applied to said node.

2. The apparatus according to claim 1, wherein the magnitudes of the first and the second reference voltage are approximately identical, but of opposite polarity.

3. The apparatus according to claim 1, wherein the resistance values between the resistor arrangement between the node and each of the load-current lines are at least approximately equal.

4. The apparatus according to claim 1, wherein the evaluation unit is set to derive the first voltage value from two or more first measured values that represent the voltage between the first load-current line and the ground point for different points in time while the first reference voltage is applied, or/and to derive the second voltage value from two or more second measured values that represent the voltage between the first load-current line and the ground point for different points in time while the second reference voltage is applied.

5. The apparatus according to claim 4, wherein the evaluation unit is set to determine out of various first pair combinations—each consisting of a first and a second measured value—the particular first pair combination, for which the difference between the associated values of the fuel cell voltage of the fuel cell system is a minimum, whereby the evaluation unit is further designed to derive the first and the second voltage value from the first and second measured value of the determined first pair combination.

6. The apparatus according to claim 5, wherein the evaluation unit is set to use the first and second measured value of the determined first pair combination as the first/second voltage value if the absolute value of the difference of the fuel cell voltage values of this first pair combination falls below a predetermined threshold.

7. The apparatus according to claim 5, wherein the evaluation unit is set to use one of the measured values of the determined first pair combination as the first or second voltage value, and to use a corrected value of the other measured value of this first pair combination as the other voltage value if the absolute value of the difference of the fuel cell voltage values of this first pair combination exceeds a predetermined threshold.

8. The apparatus according to claim 7, wherein the evaluation unit is set to determined, out of different pair combinations, each consisting of two first or two second measured values, a particular pair combination for which the difference between the associated fuel cell voltage values is a maximum, whereby the evaluation unit further is set to establish a quotient of the difference of the measured values of the determined second pair combination and the difference of the fuel cell voltage values of this second pair combination, to determine a correction value by multiplying said quotient by the difference of the fuel cell voltage values of the determined first pair combination, and to determine the corrected value of the other measured value by adding this other measured value to the correction value.

9. A method to measure the insulation resistance of a fuel cell system with respect to an electrical ground point, said method comprising
providing a resistor arrangement formed by a series connection of reference resistors between two load-current lines of the fuel cell system;
providing a reference voltage source that is arranged between the ground point and a node between the reference resistors and having an output that can be switched between at least first and second reference voltages;
providing a voltage-sensing device, which acquires the voltage between at least one of the load-current lines and the ground point;
a control and evaluation unit causing said reference voltage source to apply said first reference voltage to said node;
said voltage sensing device measuring a first voltage value, which represents a value of the voltage between a first of the load-current lines and the ground point while said first reference voltage is applied to said node;
said control and evaluation unit causing said reference voltage source to apply said second reference voltage to said node;
said voltage sensing device measuring a second voltage value, which represents a value of the voltage between the first load-current line and the ground point while said second reference voltage is applied to said node; and
said control and evaluation unit determining the insulation resistance based on the first voltage value, and on the second voltage value.

10. The method according to claim 9, further comprising at least one of the following steps:
deriving the first voltage value from at least two first measured values, which for different points in time represent the voltage between the first load-current line and the ground point while the first reference voltage is applied to said node; and
deriving the second voltage value from at least two second measured values, which for different points in time represent the voltage between the first load-current line and the ground point while the second reference voltage is applied to said node.

11. The method according to claim 10, further comprising:
determining, out of the various first pair combination, each including one first and one second measured value, a particular first pair combination for which the difference between the associated values of the fuel cell voltage of the fuel cell system is a minimum; and
deriving the first and the second voltage value from the first and the second measured value of the determined first pair combination.

12. The method according to claim 11, further comprising:
using the first and the second measured values of the determined first pair combination as the first and second voltage values if the absolute value of the difference of fuel cell voltage values of this first pair combination falls below a predetermined threshold.

13. The method according to claim 11, further comprising:
using one of the measured values of the determined first pair combination as the first or second voltage value and using a corrected value of the other measured value of the first pair combination as the other voltage value, if the absolute value of the difference of the fuel cell voltage values of this first pair combination exceeds a predetermined threshold.

14. The method according to claim 13, further comprising:
determining out of various second pair combinations, each consisting of two first or two second measured values, a particular second pair combination for which the difference between the associated fuel cell voltage values is greatest; and
determining a quotient of the difference of the measured values of the determined second pair combination;
determining a correction value by multiplying said quotient by the difference of the fuel cell voltage values of the determined first pair combination; and
determining the corrected value of the other measured value by adding this other measured value to the correction value.

15. Computer program product, comprising a computer readable medium encoded with a computer program which, when executed by a processor, effects the measurement of insulation resistance of a fuel cell system with respect to an electrical ground point by means of a measurement device, which measurement device comprises a resistor arrangement formed by a series connection of reference resistors between two load-current lines of the fuel cell system, a reference voltage source that is arranged between the ground point and a node between the reference resistors and can be switched between at least two different reference voltages, a voltage-sensing device, which acquires the voltage between at least one of the load-current lines and the ground point, wherein said computer program includes the following steps:
measuring a first voltage value, which represents a value of the voltage between a first of the load-current lines and the ground point while a first reference voltage of the reference voltage source is applied to said node;
measuring a second voltage value, which represents a value of the voltage between the first load-current line and the ground point while a second reference voltage of the reference voltage source is applied to said node; and
determining the insulation resistance based on the first voltage value, and on the second voltage value.

* * * * *